(12) United States Patent
Feldman et al.

(10) Patent No.: US 11,386,509 B2
(45) Date of Patent: *Jul. 12, 2022

(54) SYSTEM AND METHOD FOR DETERMINING HYBRID-MANUFACTURING PROCESS PLANS BASED ON SATISFIABILITY MODULO DIFFERENCE LOGIC SOLVER

(71) Applicant: Palo Alto Research Center Incorporated, Palo Alto, CA (US)

(72) Inventors: Aleksandar B. Feldman, Santa Cruz, CA (US); Morad Behandish, Foster City, CA (US); Johan de Kleer, Los Altos, CA (US); Ion Matei, Sunnyvale, CA (US); Saigopal Nelaturi, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 78 days.

This patent is subject to a terminal disclaimer.

(21) Appl. No.: 17/017,100

(22) Filed: Sep. 10, 2020

(65) Prior Publication Data

US 2022/0075357 A1 Mar. 10, 2022

(51) Int. Cl.
*G06Q 50/04* (2012.01)
*G05B 19/418* (2006.01)
*B33Y 50/02* (2015.01)

(52) U.S. Cl.
CPC .............. *G06Q 50/04* (2013.01); *B33Y 50/02* (2014.12); *G05B 19/4183* (2013.01);
(Continued)

(58) Field of Classification Search
CPC ........ G06Q 10/00–50/00; B33Y 10/00–70/00; G05B 1/00–24/00
(Continued)

(56) References Cited

U.S. PATENT DOCUMENTS

| 6,708,070 | B2* | 3/2004 | Yasuda | G06Q 10/06 700/121 |
| 10,668,664 | B1* | 6/2020 | Susnjara | B29C 64/118 |

(Continued)

*Primary Examiner* — Alan S Miller
(74) *Attorney, Agent, or Firm* — Shun Yao; Yao Legal Services, Inc.

(57) ABSTRACT

One embodiment of the present disclosure provides a system for determining a hybrid-manufacturing plan for manufacturing an object. During operation, the system can obtain a set of hybrid-manufacturing constraints for manufacturing the object. The set of hybrid-manufacturing constraints can include a set of primitives, a set of atoms, and an atom end-state vector. An atom can correspond to a unit of spatial volume of the object. A primitive can represent an additive or a subtractive manufacturing process corresponding to one or more atoms of the object. Next, the system can determine a plurality of feasible hybrid-manufacturing plans based on the set of hybrid-manufacturing constraints. Each feasible hybrid-manufacturing plan can represent an ordering of the set of primitives that satisfies the atom end-state vector. The system can then determine costs for manufacturing the object using the plurality feasible hybrid-manufacturing plans. The system can determine, based on the costs, an optimized hybrid-manufacturing plan for manufacturing the object.

20 Claims, 8 Drawing Sheets

(52) U.S. Cl.
CPC ... *G05B 19/4188* (2013.01); *G05B 19/41865* (2013.01); *G05B 19/41885* (2013.01)

(58) Field of Classification Search
USPC .............................................. 705/7.11–7.42
See application file for complete search history.

(56) References Cited

U.S. PATENT DOCUMENTS

| | | | |
|---|---|---|---|
| 10,719,069 B2* | 7/2020 | Behandish | G06F 30/17 |
| 2017/0205806 A1* | 7/2017 | Chaphalkar | G05B 19/4097 |
| 2019/0204813 A1* | 7/2019 | Behandish | B33Y 50/00 |
| 2020/0264589 A1* | 8/2020 | Reinhart | G05B 19/41865 |

* cited by examiner

```
200
Algorithm: CONVERTING CONSTRAINT MATRIX TO SMT

Input : M = (P, A, X, F, C), manufacturing constraints
Output : φ SMT formula, conjunction of disjunction of inequalities
φ ← ∅
for i ∈ 1, 2, ..., m do
    φ' ← ∅
    for j ∈ 1, 2, ..., n do
        for k ∈ j+1, j+2, ..., n do
            if |x_j| = 1 ∧ x_k = 0 then
                φ' ← φ' ∨ x_k < x_j
            end
        end
    end
    φ ← φ ∧ φ'
end
return φ
```

SYSTEM AND METHOD FOR DETERMINING HYBRID-MANUFACTURING PROCESS PLANS BASED ON SATISFIABILITY MODULO DIFFERENCE LOGIC SOLVER

BACKGROUND

Field

This disclosure is generally related to hybrid-manufacturing planning. More specifically, this disclosure is related to a system and method for determining a hybrid-manufacturing plan based on a satisfiability modulo difference logic solver.

Related Art

Computing manufacturing plans for pre-designed 3-dimensional (3D) objects is at the frontier in artificial intelligence (AI). Different types of manufacturing technologies are available for manufacturing complex 3D structures. Specifically, additive manufacturing technology can be used to manufacture complex 3D objects by adding materials in a layered fashion, e.g., adding material by a 3D printer. Subtractive manufacturing technology can also be used to manufacture 3D objects by removing material, e.g., by cutting, drilling, grinding, and boring a block of material to a desired form within a specified tolerance. Some manufacturing technologies leverage the advantages of additive and subtractive manufacturing by combining the two for fabricating the 3D object. However, performing additive and subtractive manufacturing separately, e.g., by separate machines, may result in additional post-processing operations before transitioning from one manufacturing technology to another. Such additional post-processing can result in increased time-to-market and can also increase the cost of manufacturing the 3D object.

With the advancement in manufacturing technologies, new systems are capable of combining additive and subtractive manufacturing techniques in a single machine to perform a hybrid-manufacturing process. Current hybrid-manufacturing approaches typically first complete additive manufacturing steps followed by subtractive manufacturing steps. However, a hybrid-manufacturing process faces some challenges with respect to planning different manufacturing steps for fabricating the physical 3D object in a cost-effective and efficient way.

SUMMARY

According to one embodiment of the present invention, a system and method for determining a hybrid-manufacturing plan for manufacturing an object. During operation, the system can obtain a set of hybrid-manufacturing constraints for manufacturing the object. The set of hybrid-manufacturing constraints can include a set of primitives, a set of atoms, and an atom end-state vector. An atom can correspond to a unit of spatial volume of the object. A primitive can represent an additive or a subtractive manufacturing process corresponding to one or more atoms of the object. Next, the system can determine a plurality of feasible hybrid-manufacturing plans based on the set of hybrid-manufacturing constraints. Each feasible hybrid-manufacturing plan can represent an ordering of the set of primitives that satisfies the atom end-state vector. The system can then determine costs for manufacturing the object using the plurality feasible hybrid-manufacturing plans. The system can determine, based on the costs, an optimized hybrid-manufacturing plan for manufacturing the object.

In a variation on this embodiment, the set of hybrid manufacturing constraints can include: a constraint matrix with the columns corresponding to the set of primitives and the rows corresponding to the set of atoms; and an atom cost vector.

In a further variation on this embodiment, the system can convert the set of hybrid-manufacturing constraints to a satisfiability modulo theory (SMT) problem. The system can determine the feasible hybrid-manufacturing plans by solving a Satisfiability (SAT) modulo difference logic.

In a further variation on this embodiment, each cost can be associated with one or more of: tool set-up cost; shutdown cost; and material cost.

In a further variation, the system can convert the set of hybrid-manufacturing constraints to the SMT problem by: generating a conjunctive normal form (CNF) modulo difference logic formula; and converting the CNF difference logic formula to a Boolean formula, wherein the Boolean formula is implemented by using at least one or more Boolean subtractor circuits.

In a variation of this embodiment, the system can determine the plurality of feasible hybrid-manufacturing plans by performing for a respective feasible hybrid-manufacturing plan the following operations: sorting one or more columns in a constraint matrix based on one or more variables in the feasible hybrid-manufacturing plan, wherein each column corresponds to a primitive, and wherein sorting the one or more columns in the constraint matrix corresponds to changing an order of the set of primitives determining, for each primitive, an atom count representing a number of atoms added or deleted; determining an atom cost associated with each primitive; and determining a cost of the feasible hybrid-manufacturing plan by multiplying the atom cost and the atom count for respective primitives and aggregating across the set of primitives.

In a variation of this embodiment, the system can determine, based on the costs, the optimized hybrid-manufacturing plan by applying a binary search to the costs to determine the optimized hybrid-manufacturing plan.

BRIEF DESCRIPTION OF THE FIGURES

In the figures, like reference numerals refer to the same figure elements.

DETAILED DESCRIPTION

Figure 1:
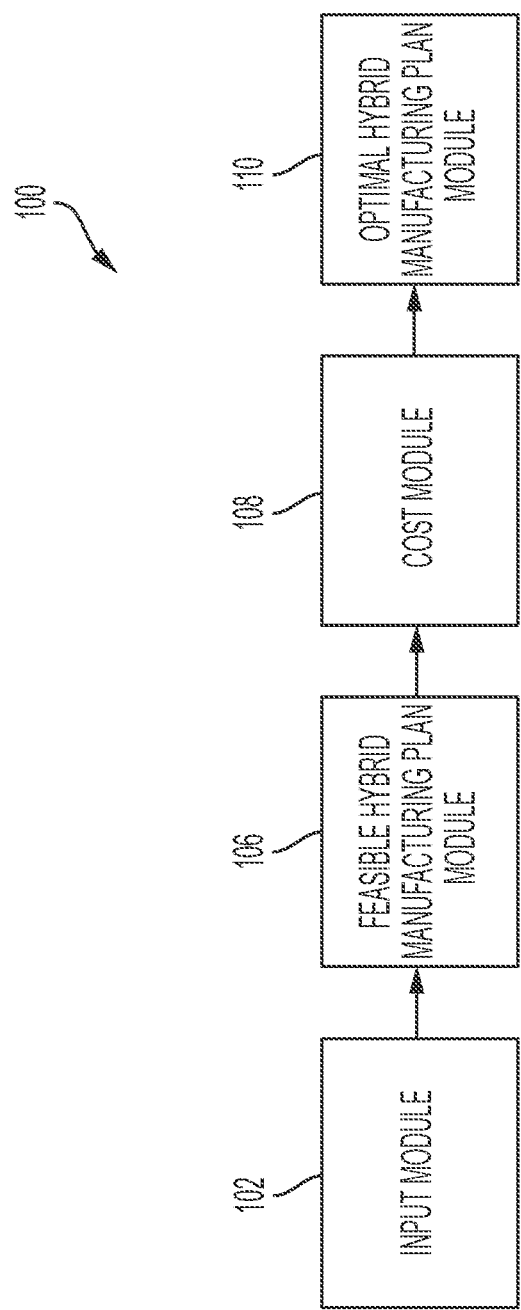
FIG. 1 shows an exemplary system block diagram for determining a hybrid-manufacturing plan, in accordance with one embodiment of the present disclosure.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments described herein solve the technical problem of determining optimized hybrid-manufacturing plans for fabricating a mechanical object. Specifically, a system can determine a sequence of additive or subtractive operations in a cost-effective and efficient way to obtain the object. During operation, the system can obtain a set of hybrid-manufacturing constraints that can include a final state vector and a constraint matrix including a set of primitives and a set of atoms, which can correspond to different spatial volumes associated with the mechanical object. That is, the 3D space in which the pre-designed mechanical object is embedded can be partitioned into a number of spatial volumes, with each volume represented by an atom. A subcollection of these atoms form the pre-designed mechanical object, or an approximation of it as deemed sufficiently accurate by user-specified tolerances. Each primitive in the set of primitives can add or remove a subcollection of atoms representing the spatial volume in a single additive or subtractive manufacturing operation, respectively. The atoms represent the smallest spatial volumes that can be added or removed at once, however, they cannot be added or removed independently. They are physically constrained to be added or removed alongside other atoms in a primitive representing a feasible manufacturing action. Each primitive is computed by analyzing the geometry of the pre-designed mechanical part against the tool shape, machine degrees of freedom, and possibly other manufacturing parameters. The atoms are subsequently computed as canonical intersection regions among primitives and their complements in 3D space.

A hybrid-manufacturing process plan (or simply a "plan") is defined by a sequence of manufacturing actions represented by adding or removing the primitives. A plan is feasible if it produces the pre-designed mechanical object, or an approximation of it as deemed sufficiently accurate by user-specified tolerances. To achieve this end-goal, it is necessary and sufficient to have every atom inside the object present and every atom outside the object absent at the end of a process plan. The sufficient conditions for this to happen can be specified by a constraint matrix obtained by analyzing how the order of primitives in the sequence affects the presence or absence of atoms at the end of the plan. Each feasible plan can represent a different ordering of the primitives for fabricating the same mechanical object, i.e., the same subcollection of atoms that end up being present after the different sequences of additive and subtractive primitives are applied. Each of the feasible plans may result in fabricating the pre-designed mechanical object at a different cost, which normally depends on how the atoms appear and disappear in the intermediate stages of the plan. Hybrid-manufacturing process planning may refer to finding one or a plurality of feasible plans, all feasible process plans, or any distinguished subset of feasible process plans, for instance, the most cost-effective process plans The system can convert the constraint matrix to a satisfiability modulo theory (SMT) problem that can be solved to determine a plurality of feasible hybrid-manufacturing plans. To determine a feasible hybrid-manufacturing plan that is cost effective and efficient, the system may integrate a cost module to compute a cost of each plan. The output of the cost module can be a plurality of costs corresponding to the plurality of feasible hybrid-manufacturing plans. Based on the plurality of costs, the system can apply a search technique to determine an optimized hybrid-manufacturing plan for fabricating the pre-designed mechanical object.

System and Method for a Hybrid-Manufacturing Planner

FIG. 1 shows an exemplary system block diagram for determining a hybrid-manufacturing plan, in accordance with one embodiment of the present disclosure. A hybrid-manufacturing plan can correspond to a sequence of additive or subtractive processes for manufacturing the mechanical object. In hybrid-manufacturing, it is desirable to carefully plan the ordering of the additive and subtractive manufacturing processes so that the final fabricated mechanical object matches the design specifications in a cost-effective way.

In the example shown in FIG. 1, system 100 can determine a hybrid-manufacturing plan for a pre-designed mechanical object. System 100 can include an input module 102 that can define a set of manufacturing constraints. Specifically, a hybrid-manufacturing problem M can be defined as a tuple $\langle P, A, X, F, C \rangle$ that includes multiple sets of constraints defined as:

$$P = \{p_1, p_2, \ldots, p_m\} \quad (1)$$

$$A = \{a_1, a_2, \ldots, a_n\} \quad (2)$$

$$X \in \{-1, 0, 1\}^{m,n} \quad (3)$$

$$F \in \{-1, 0, 1\}^n \quad (4)$$

$$C \in \mathbb{Z}^m \quad (5)$$

where P denotes a set of primitives, A denotes a set of atoms, X represents a constraint matrix, F represents an atom end-state vector, and C denotes an atom cost vector.

Primitives can be grouped into two categories, additive manufacturing (AM) primitives and subtractive manufacturing (SM) primitives. An AM primitive or a SM primitive can characterize a manufacturing step or a manufacturing capability (e.g., 3D printing, milling, or turning). For the purpose of defining the hybrid-manufacturing constraints, the pre-designed mechanical object can be divided into volume units (each of which can have a different shape) and each unit of volume can be represented as an atom. Specifically, an atom can represent a spatial volume in Euclidean space that is classified as completely inside or completely outside against all primitives i.e., the one or more primitives that include that atom will add or remove them upon the additive or subtractive primitive's action, respectively.

The constraint matrix X (shown in equation (3)) is an n×m matrix with the rows representing atoms A and the columns representing primitives P denoted by equations (2) and (1), respectively. The constraint matrix may inherently include additional details, e.g., co-ordinates in Euclidean space to indicate where to perform a drilling operation, type of tool to be used to perform an operation, description of the toolset, etc. The constraint matrix X can be represented as an array of (−1, 0, 1) assignments with two bits per integer. Table 1 below describes the meaning of different values associated with element $x_{i,j}$ in the constraint matrix X.

TABLE 1

Description of element values in constraint matrix X

| Constrain matrix X element values | Description |
| --- | --- |
| $x_{i,j} = 1$ | primitive $p_j$ adds atom $a_i$ |
| $x_{i,j} = -1$ | primitive $p_j$ removes atom $a_i$ |
| $x_{i,j} = 0$ | primitive $p_j$ neither adds nor removes atom $a_i$ |

Atom end-state vector F represents the final design specification that is desired to be satisfied. An element in the atom end-state vector F can be denoted as $f_i$. Table 2 below describes the meaning of different values in the atom end-state vector F.

TABLE 2

Description of element values in atom end-state vector F

| Final state vector, F, values | Description |
| --- | --- |
| $f_i = 1$ | atom $a_i$ desired to be filled in the final design |
| $f_i = -1$ | atom $a_i$ is desired to be empty in the final design |
| $f_i = 0$ | atom $a_i$ can be filled or empty in the final design |

For example, hybrid-manufacturing system 100 characterized by four primitives, i.e., $P=\{p_1, p_2, p_3, p_4\}$, and five atoms, i.e., $A=\{a_1, a_2, a_3, a_4, a_5\}$, can be associated with the following set of manufacturing constraints data:

$$X = \begin{bmatrix} 0 & -1 & 1 & 0 \\ 1 & 0 & 1 & 0 \\ 0 & -1 & 0 & 0 \\ 1 & -1 & 1 & 0 \\ 1 & 0 & 1 & -1 \end{bmatrix} ; F = \begin{bmatrix} 1 \\ -1 \\ 0 \\ 0 \\ -1 \end{bmatrix} ; \quad (6)$$

$$C = \begin{bmatrix} 10 \\ 2 \\ 2 \\ 90 \\ 8 \end{bmatrix}$$

Vector C in equation (6) denotes a cost vector corresponding to the manufacture of the five atoms by applying primitives defined in constraint matrix X.

System 100 can include a feasible hybrid-manufacturing plan module 102 to determine, based on the manufacturing constraints, a plurality of feasible hybrid-manufacturing plans. Given the hybrid-manufacturing constraints M, with primitives P (as denoted in equation (1)), a hybrid-manufacturing plan P(M) can represent a total ordering of the primitives in P. Feasible hybrid-manufacturing plan module 102 can compute a plan P(M) to provide a total ordering of the primitives in P that when implemented may result in a final state of atoms in A that can satisfy the atom end-state vector F. In other words, in each hybrid manufacturing step, a primitive $p_{j\in\{1, 2, \ldots, m\}}$ may add an atom $a_{i\in\{1, 2, \ldots, n\}}$ if the atom is not present (and have no effect on it otherwise); or a primitive $p_j$ may remove the atom $a_i$ if the atom is present (and have no effect on it otherwise). At the last hybrid-manufacturing step, an atom is desired to be present when $f_i=1$ and an atom is desired to be absent when $f_i=-1$. Feasible hybrid-manufacturing plan module 102 may determine a number of such feasible hybrid-manufacturing plans, however all of them may not result in an optimal feasible hybrid-manufacturing plan that is cost effective and efficient.

Therefore, a cost module 108 is integrated into system 100 to determine a cost for each of the feasible hybrid-manufacturing plans. Specifically, given constraints M and a feasible hybrid-manufacturing plan P(M), cost module 108 can determine a cost of the plan, where the cost can be defined as:

$$\text{cost}(P) = \Sigma_{i=1}^m q_i c_i \quad (7)$$

where $q_i \in \mathbb{Z}$ denotes the number of times an atom is added or removed by a feasible hybrid-manufacturing plan P(M) and $c_i$ denotes the cost associated with each primitive when implementing plan P(M).

In response to cost module 108 determining a cost(P) for each feasible hybrid-manufacturing plan P(M), an optimal hybrid-manufacturing plan module 110 can determine an optimal hybrid-manufacturing plan such that the cost(P) is minimized. The operations of feasible hybrid-manufacturing plan module 106, cost module 108, optimal hybrid-manufacturing plan module 110 are further described in relation to FIGS. 2-7.

Figures 2, 3:
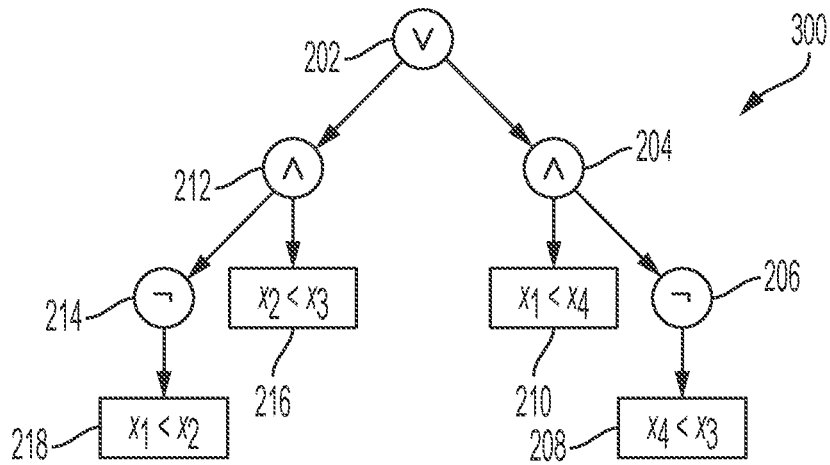
FIG. 2 shows an exemplary algorithm for converting a constraint matrix to a SMT formula, in accordance with one embodiment of the present disclosure.
FIG. 3 shows an example SMT function, in accordance with one embodiment of the present disclosure.

FIG. 2 shows an exemplary method for converting a constraint matrix to an SMT formula, in accordance with one embodiment of the present disclosure. Method 200 represents a planning process. In other words, method 200 can convert the problem of determining a feasible hybrid-manufacturing plan and an optimal hybrid-manufacturing plan into an SMT problem. In one embodiment, the SMT can be difference logic theory, hence method 200 can convert a hybrid-manufacturing planning problem to a satisfiability (SAT) modulo difference logic.

Method 200 may convert the hybrid-manufacturing planning problem to a Conjunctive Normal Form (CNF) format, thus enabling the system to determine the satisfiability of a CNF formula using SAT modulo difference logic. A CNF modulo difference logic formula over a set of integer variables, $X=\{x_1, x_2, \ldots, x_n\}$ can be defined as a conjunction of disjunction of literals:

$$\varphi = \bigwedge_{p\in P} \bigvee_{q\in Q} p<q \quad (8)$$

where $\{p,q\} \subseteq X^2$. Given the manufacturing constraints the system can convert a constraint matrix defined in equation (3) to an SMT formula according to method 200. In other words, given the manufacturing constraints, method 200 can determine the precedence of the primitives. For example, a primitive can only add material to an atom if that material has not previously been added, and a primitive can only remove a material only if the material exists. Therefore, proper ordering of the primitives can be necessary for correctly fabricating different complex structures in the pre-designed mechanical object.

FIG. 3 shows an example SMT function, in accordance with one embodiment of the present disclosure. The example SMT function can implement the formula determined by algorithm shown in FIG. 2. Specifically, given the constraint matrix X, the formula can be denoted in CNF as:

$$\varphi = (\neg(x_1 < x_2) \land (x_2 < x_3)) \lor ((x_1 < x_4) \lor (x_4 < x_3)) \quad (9)$$

The Boolean operators used in equation (9) are negation ($\neg$), disjunction ($\lor$), and conjunction ($\land$). In FIG. 3, the Boolean function $\varphi$ defined in equation (9) can be represented in the form of a tree topology 300. The leaf nodes in tree 300 represent variables with inequalities, i.e., 208, 210, 216, and 218, and these leaf nodes with inequalities can be called as the theory. The variables $\{x_1, x_2, \ldots, x_n\}$ can be integer variables. The non-leaf nodes are Boolean operators 202-206, 212, and 214. For example, the negation operation 214 on inequality 218, i.e., $\neg(x_1 < x_2)$, can result in inequality $(x_1 \geq x_2)$. The inequality $(x_1 < x_2)$ can indicate that primitive $x_1$ precedes primitive $x_2$.

At node 212 a conjunction operation is performed on 216 and the inequality $(x_1 \geq x_2)$, to generate an inequality $(x_1 \geq x_2) \land (x_2 < x_3)$. Similarly, operations 206 and 204 on inequalities 208 and 210, respectively, can result in $(x_4 \geq x_3) \land (x_1 < x_4)$. A disjunction operation 202 on the results of the two branches in tree 300, i.e., $(x_1 \geq x_2) \land (x_2 < x_3)$ and $(x_4 \geq x_3) \land (x_1 < x_4)$ is denoted in equation (9). The inequality $(x_2 < x_3)$ can indicate that primitive $x_2$ precedes primitive $x_3$. Similarly, inequality $(x_1 < x_4)$ can indicate that primitive $x_1$ precedes primitive $x_4$.

In one embodiment, the system can determine a feasible hybrid-manufacturing plan from the SMT formula shown in equation (9) by implementing an SMT solver. The output of the SMT solver can correspond to an assignment of all variables $x_i$ in $\varphi$ such that $\varphi$ evaluates to a Boolean constant T. Optionally, the system can convert $\varphi$ to a Boolean formula by encoding every integer variable $x_i$ as a Boolean vector and each proposition of type $x_i < x_j$ can be replaced by a Boolean subtractor. A Boolean subtractor using ripple borrow architecture is described below in relation to FIGS. 4A and 4B.

Figure 4A:
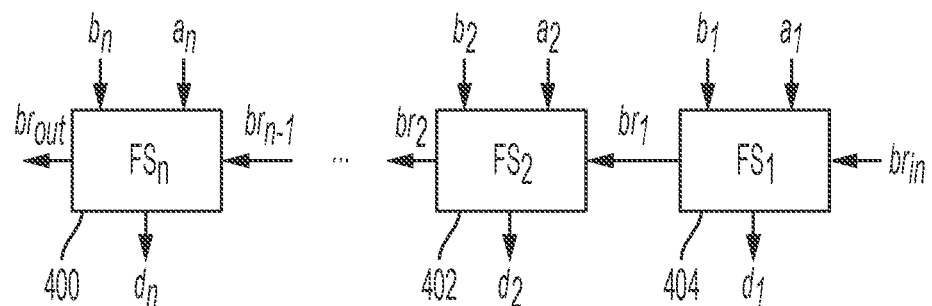
FIG. 4A shows an exemplary ripple-borrow subtractor circuit, in accordance with one embodiment of the present disclosure.

FIG. 4A shows an exemplary ripple-borrow subtractor circuit, in accordance with one embodiment of the present disclosure. An n-bit ripple-borrow subtractor can include a cascade of N full subtractors 400-404. A full subtractor is a combinational circuit that can have three inputs and two outputs. Specifically, each full subtractor (FS) in FIG. 4A can have three binary inputs and two binary outputs. For example, consider FS 402 that has three inputs, i.e., $a_2$, $b_2$, and $br_1$. The binary inputs $a_2$ and $b_2$ represent the inputs that are to be subtracted, and input $br_1$ can represent a borrow bit. If a subtraction operation in FS 404 associated with the least significant bit, resulted in a borrow operation borrow bit $br_1$ will be set to 1 otherwise it will be set to zero. Output of subtraction operation performed by FS 402 is denoted as $d_2$ and if a borrow operation was performed by FS 402 then $br_2$ will be set to one otherwise it will be set to zero. Alternatively, instead of the ripple-borrow full subtractor the system can use borrow-look-ahead subtractors, two's complements, sign inverters, or full-adders.

Figure 4B:
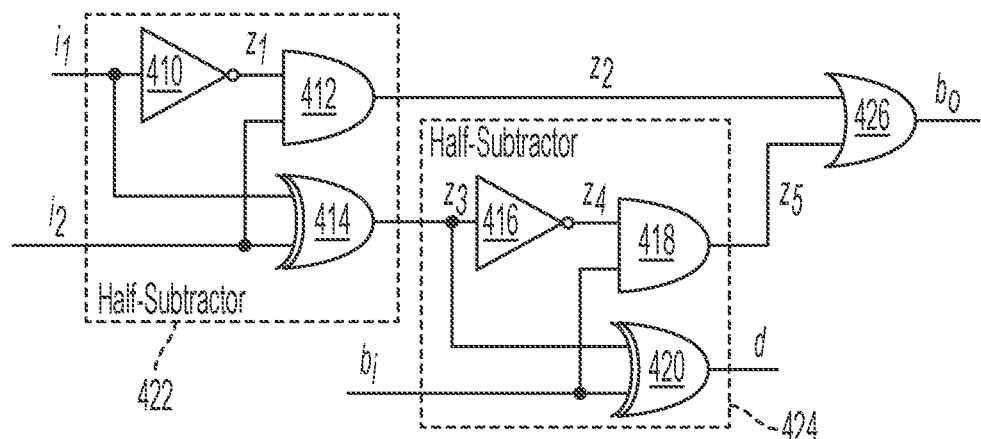
FIG. 4B shows an exemplary example of a full-subtractor circuit, in accordance with one embodiment of the present disclosure.

FIG. 4B shows an exemplary example of a full-subtractor circuit, in accordance with one embodiment of the present disclosure. A full-subtractor circuit can subtract two binary numbers $i_1$ and $i_2$. The full-subtractor circuit can include a third input, i.e., a borrow input bit $b_1$. The outputs can be the difference d and the borrow output $b_0$. The full-subtractor circuit can be implemented by using two half-subtractors, i.e., 422 and 424, and an OR gate 426. Each half-subtractor, i.e., 422 and 424, can be implemented by one XOR gate, one AND gate, and one NOT gate. Specifically, half subtractor 422 can be implemented by XOR gate 414, AND gate 412, and NOT gate 410. Likewise, half subtractor 424 can be implemented by XOR gate 420, AND gate 418, and NOT gate 416.

The system can solve the SMT formula shown in equation (9) to generate a feasible hybrid-manufacturing plan. In one embodiment, the system in response to finding the first feasible hybrid-manufacturing plan may apply different permutations of the primitives associated with the constraint matrix to generate a corresponding SMT formula. The system may solve each SMT formula using the SMT solver to generate a plurality of feasible hybrid-manufacturing plans. Alternatively, the system can also randomize the SMT solver to return a different solution each time the SMT solver is implemented. Applying a stochastic search over the plurality of feasible hybrid-manufacturing plans may return a feasible solution with a good cost.

To perform a search for a cost-optimal solution, the system may compute a cost associated with each feasible hybrid-manufacturing plan. Therefore, to determine a cost-optimal hybrid-manufacturing plan, the system may incorporate in the SMT formula the computation of the cost and may add a binary search space including costs associated with the plurality of feasible hybrid-manufacturing plans. An architecture of such an SMT augmented formula that can also compute costs is described below in relation to FIG. 5.

Figure 5:
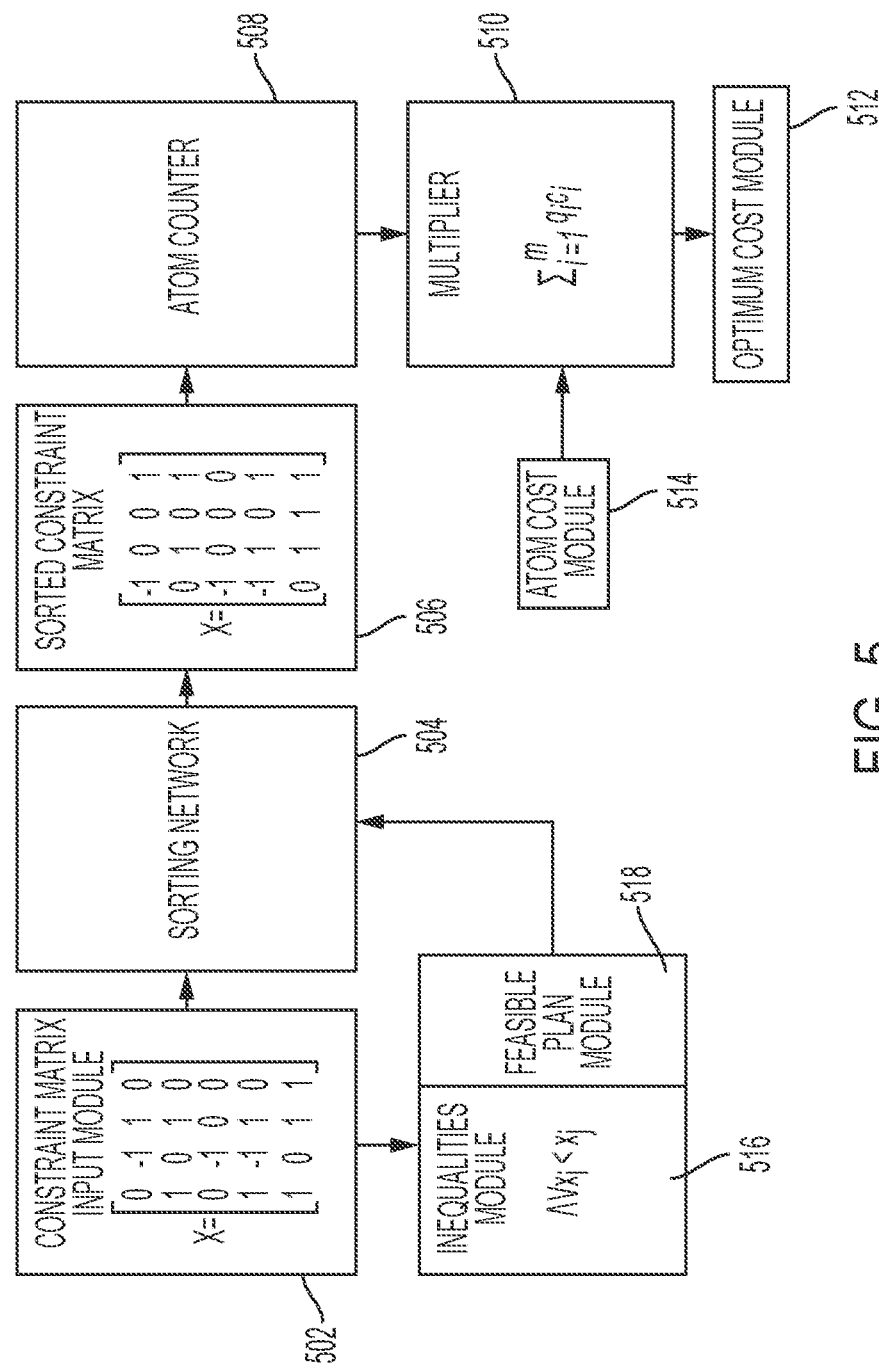
FIG. 5 illustrates an exemplary block diagram of a system performing a SMT augmented function, in accordance with one embodiment of the present disclosure.

FIG. 5 illustrates an exemplary block diagram of a system performing a SMT augmented function, in accordance with one embodiment of the present disclosure. System 500 may include a constraint matrix input module 502 that provides a constraint matrix to inequalities module 516 where the constraint matrix can be converted to a SMT formula using the algorithm shown in FIG. 2. System 200 can then apply a feasible plan module 518 to determine a feasible plan. The system can use the variables in the feasible plan as keys in a sorting network 504. Sorting network 504 can sort the columns of the constraint matrix to generate a sorted constraint matrix shown in 506, each sorting can correspond to a different ordering of the primitives. An atom counter module 508 can compute the number of added or deleted atoms per primitive. System 500 can then apply a multiplier 508 to multiply the output, i.e., atom count, of counter module 508 with integer atom costs according to equation (7). Atom cost module 514 can compute a cost associated with each atom. System 500 can then apply an optimum cost module 512 to determine a cost-optimal solution. Specifically, system 500 may apply optimal cost module 512 to perform a binary search over all the feasible solutions and can determine a feasible solution with an optimal cost.

Figure 6:
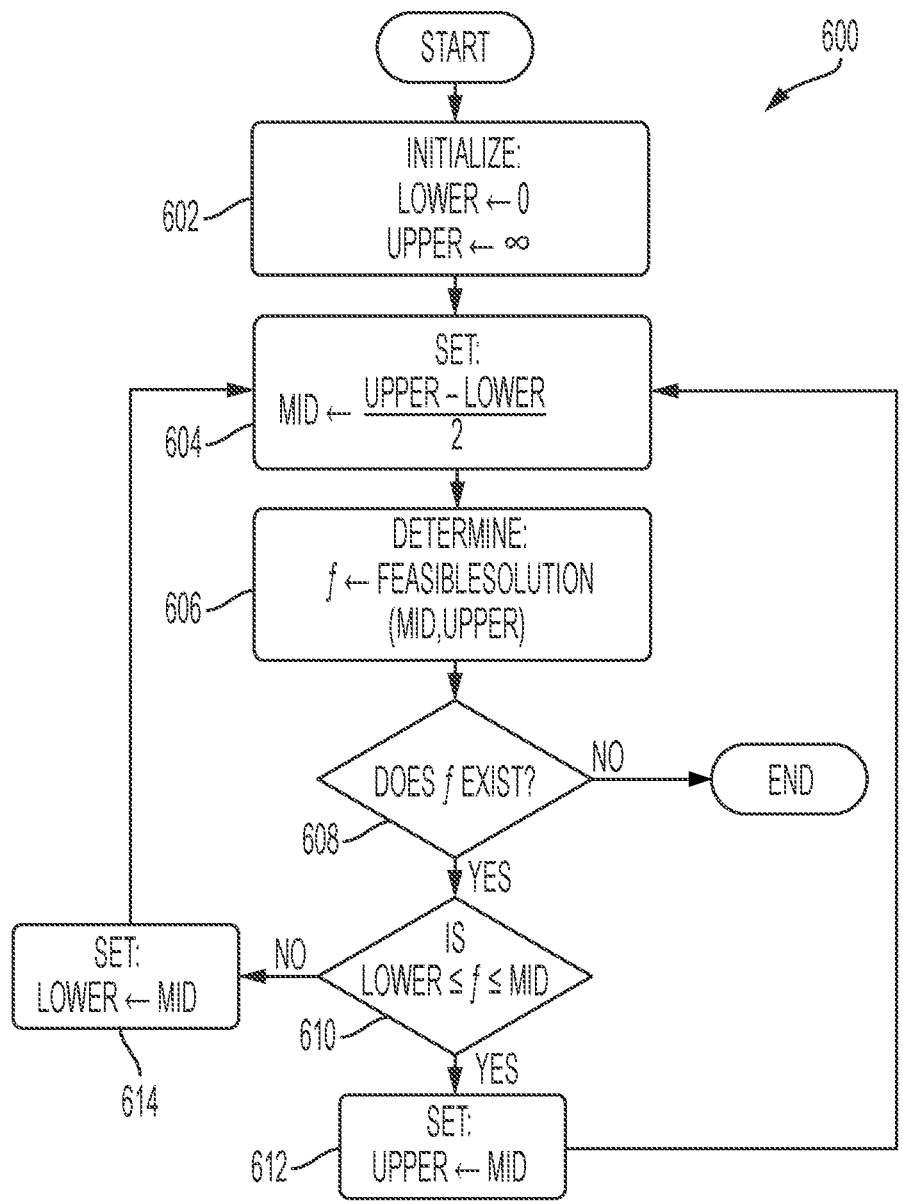
FIG. 6 presents a flowchart illustrating a process for finding a cost-optimal solution, in accordance with one embodiment of the present disclosure

FIG. 6 presents a flowchart illustrating a process for finding a cost-optimal solution, in accordance with one embodiment of the present disclosure. In one embodiment the system uses an SMT solver to determine a plurality of feasible hybrid-manufacturing plans, the system may further incorporate in the SMT solver a binary search over a search space including the plurality of feasible hybrid-manufacturing plans. First, the system may initialize a lower and upper bound in the search space (operation 602). The system can then determine a median of the search space based on the lower and upper bounds (operation 604). The system can determine the presence of an optimal-feasible solution based on the costs of respective feasible hybrid-manufacturing plans in the second half of the search space, i.e., from the median of the search space to the upper bound of the search space (operation 606).

The system can determine whether a cost-optimal solution exists in the selected search space (operation 608). If no solution exists then the operation ends, otherwise the system can continue to determine whether the cost-optimal feasible solution exists in the first half of the search space (operation 610). If the condition in operation 610 is satisfied, then the system can update the upper bound to the median value (operation 612) and the operation continues to label 604. In other words, the system may identify a presence of a better solution in the first half of the search space, therefore the system may continue to narrow the search in the first half of the search space. If the condition in operation 610 is not satisfied, the system can update the lower bound to the median value (operation 614) and the operation continues to label 604. In other words, the system may identify a presence of a better solution in the second half of the search space, therefore the system may continue to narrow the search in the second half of the search space. The system can continue the search until a cost-optimal feasible hybrid-manufacturing plan is found. With the incorporation of the cost computation and the binary search operations, the SMT solver can find a specific ordering of primitives that results in a cost-optimal feasible hybrid-manufacturing plan.

Figure 7:
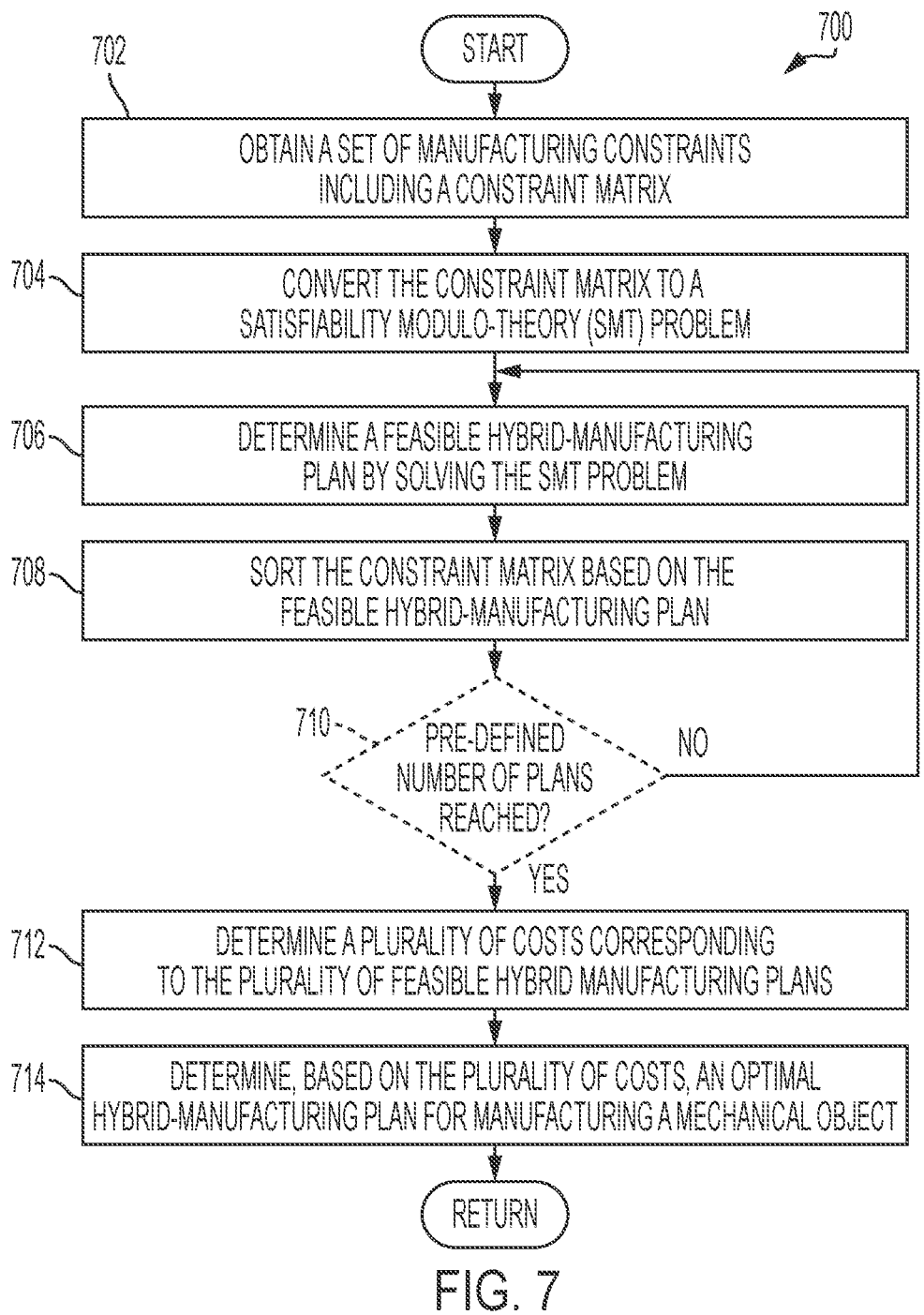
FIG. 7 presents a flowchart illustrating a process for determining a hybrid manufacturing plan by using a satisfiability modulo difference logic solver, in accordance with one embodiment of the present disclosure.

FIG. 7 presents a flowchart illustrating a process for determining a hybrid manufacturing plan by using a satisfiability modulo difference logic solver, in accordance with one embodiment of the present disclosure. During operation, the system can obtain a set of manufacturing constraints defined in equations (1)-(4) (operation 702). The set of manufacturing constraints can include a constraint matrix which can provide a comprehensive description of the type of primitives and the atoms on which the primitives can operate. The system can then convert the constraint matrix to a SMT problem (operation 704). Next, the system can determine a feasible hybrid-manufacturing plan by solving the SMT problem (operation 706). The feasible hybrid-manufacturing plan provides a certain ordering of the primitives that satisfies the constraints in the atom end-state vector defined in equation (4). Based on the feasible hybrid-manufacturing plan, the system can sort the constraint matrix to generate a different constraint matrix (operation 708).

The system may optionally determine whether a predefined number of feasible hybrid-manufacturing plans have been computed (operation 710). When the condition in operation 710 is not satisfied, the system can continue to operation 706 to determine a different feasible hybrid-manufacturing plan in each iteration until the pre-defined number of feasible hybrid-manufacturing plans have been reached. When the condition in operation 710 is satisfied, the system can determine a plurality of costs corresponding to the plurality of feasible hybrid-manufacturing plans (operation 712). The system can then determine, based on the plurality of costs, a cost-optimal hybrid manufacturing plan for manufacturing a mechanical object (operation 714).

Exemplary Computer System and Apparatus

Figure 8:
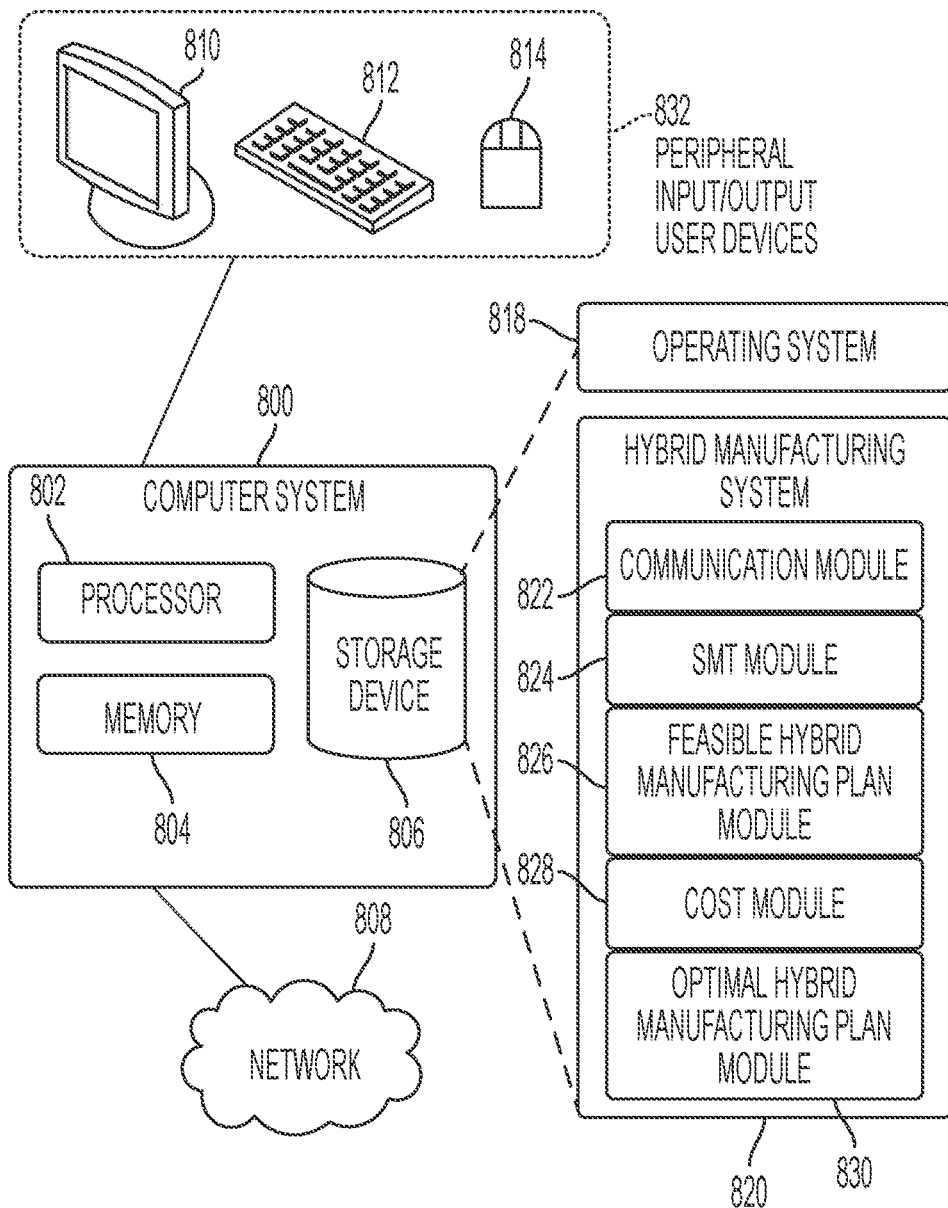
FIG. 8 illustrates an exemplary computer system that facilitates a hybrid-manufacturing planner using a satisfiability modulo difference logic solver, in accordance with one embodiment of the present disclosure.

FIG. 8 illustrates an exemplary computer system that facilitates a hybrid-manufacturing planner using a satisfiability modulo difference logic solver, in accordance with one embodiment of the present disclosure. In this example, computer system 800 can include a processor 802, a memory 804, and a storage device 806. Computer system 800 can be coupled to peripheral input/output (I/O) user devices 830, e.g., a display device 810, a keyboard 812, and a pointing device 814, and can also be coupled via one or more network interfaces to network 808. Storage device 806 can store instructions for an operating system 818 and a hybrid manufacturing system 820.

In one embodiment, hybrid manufacturing system 820 can include instructions, which when executed by processor 802 can cause computer system 800 to perform methods and/or processes described in this disclosure. Hybrid manufacturing system 820 can include a communication module 822 to receive a set of manufacturing constraints. Hybrid manufacturing system 820 can further include instructions implementing a SMT module 824 for converting the constraint matrix to a SMT problem.

Hybrid manufacturing system 820 can include a feasible hybrid manufacturing plan module 826, which can determine a feasible hybrid manufacturing plan by using an SMT solver. Feasible hybrid manufacturing plan module 826 can further sort the constraint matrix to generate a different constraint matrix. For each new constraint matrix, feasible hybrid manufacturing plan module 826 can determine a different feasible hybrid-manufacturing plan. Therefore, feasible hybrid manufacturing plan module 826 can iteratively generate a plurality of feasible hybrid-manufacturing plans.

Hybrid manufacturing system 820 can also include a cost module 828 for determining a plurality of costs for manufacturing the mechanical object using the corresponding plurality of feasible hybrid-manufacturing plans. Hybrid manufacturing system 820 can further include an optimal hybrid-manufacturing plan module 830 to determine a cost-optimal hybrid-manufacturing plan by for example applying a binary search to the search space including the plurality of feasible plans with associated costs. Hybrid manufacturing system 820 may then use communication module 822 to output the cost-optimal hybrid-manufacturing plan for fabricating the mechanical object. Hybrid manufacturing system 820 may applied for logistics, e.g., arranging containers in a port, etc. Hybrid manufacturing system 82 may further be applied to other fields, e.g., electronics printing, assembly, packaging, layout planning, optimization, etc.

Figure 9:
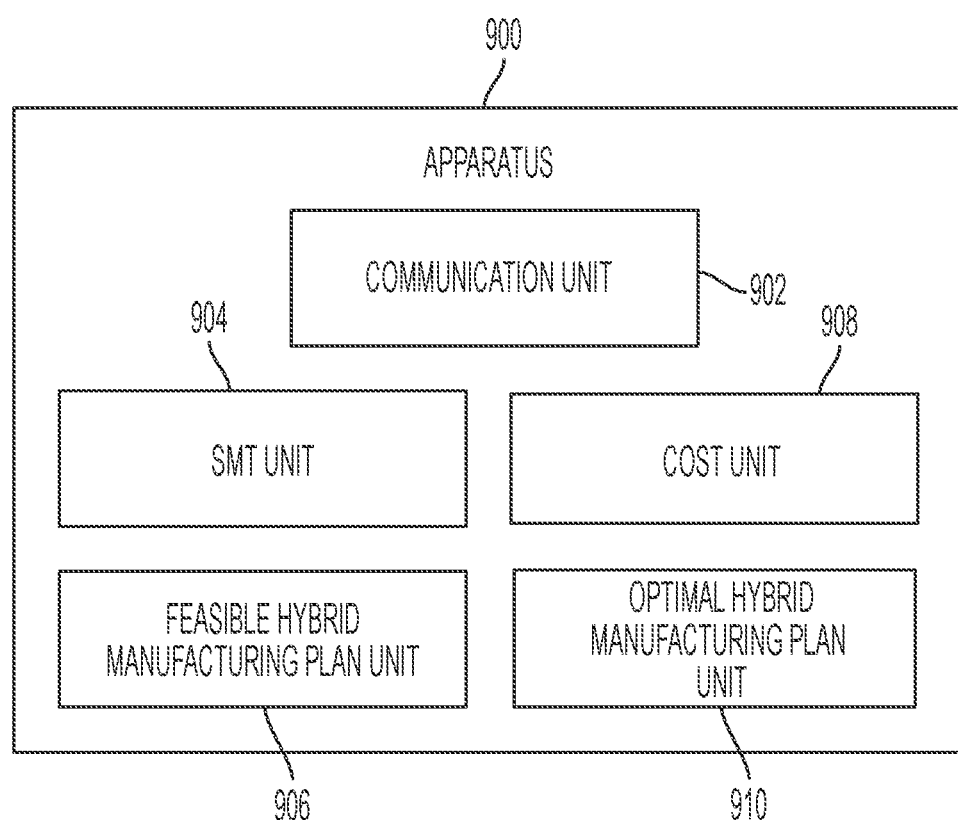
FIG. 9 illustrates an exemplary apparatus that facilitates a hybrid-manufacturing planner using a satisfiability modulo difference logic solver, in accordance with one embodiment of the present disclosure.

FIG. 9 illustrates an exemplary apparatus that facilitates a hybrid-manufacturing planner using a satisfiability modulo difference logic solver, in accordance with one embodiment of the present disclosure. Apparatus 900 can include units 902-910, which perform functions or operations similar to modules 822-830 of computer system 800 in FIG. 8, respectively. Apparatus 900 can include: a communication unit 902, a SMT unit 904, a feasible hybrid-manufacturing plan unit 906, a cost unit 908, and an optimal hybrid-manufacturing plan unit 910.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules or apparatus. The hardware modules or apparatus can include, but are not limited to, application-specific integrated circuit (ASIC) chips, field-programmable gate arrays (FPGAs), dedicated or shared processors that execute a particular software module or a piece of code at a particular time, and other programmable-logic devices now known or later developed. When the hardware modules or apparatus are activated, they perform the methods and processes included within them.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for determining a hybrid-manufacturing process plan for manufacturing an object, the method comprising:
   obtaining, by a computer, a set of hybrid-manufacturing constraints for manufacturing the object, wherein the set of hybrid-manufacturing constraints include a set of primitives, a set of atoms, and an atom end-state vector, wherein an atom corresponds to a unit of spatial volume of the object, and wherein a primitive represents an additive or subtractive manufacturing process corresponding to one or more atoms of the object;
   determining a plurality of feasible hybrid-manufacturing plans based on the set of hybrid-manufacturing constraints, wherein each feasible hybrid-manufacturing plan represents an ordering of the set of primitives that satisfies the atom end-state vector;
   determining costs for manufacturing the object using the plurality of feasible hybrid-manufacturing plans; and
   determining, based on the costs, an optimized hybrid-manufacturing plan for manufacturing the object.

2. The method of claim 1, wherein the set of hybrid manufacturing constraints further comprises:
   a constraint matrix with the columns corresponding to the set of primitives and the rows corresponding to the set of atoms; and
   an atom cost vector.

3. The method of claim 1, further comprising converting the set of hybrid-manufacturing constraints to a satisfiability modulo theory (SMT) problem;
   wherein determining the feasible hybrid-manufacturing plans comprises solving the SMT problem using a Satisfiability (SAT) modulo difference logic.

4. The method of claim 1, wherein each cost is associated with one or more of:
   tool set-up cost;
   shut-down cost; and
   material cost.

5. The method of claim 1, further comprising converting the set of hybrid-manufacturing constraints to an SMT problem by:
   generating a conjunctive normal form (CNF) modulo difference logic formula; and
   converting the CNF difference logic formula to a Boolean formula, wherein the Boolean formula is implemented by using at least one or more Boolean subtractor circuits.

6. The method of claim 1, wherein determining the plurality of feasible hybrid-manufacturing plans further comprises:
   for a respective feasible hybrid-manufacturing plan:
      sorting one or more columns in a constraint matrix based on one or more variables in the feasible hybrid-manufacturing plan, wherein each column corresponds to a primitive, and wherein sorting the one or more columns in the constraint matrix corresponds to changing an order of the set of primitives;
      determining, for each primitive, an atom count representing a number of atoms added or deleted;
      determining an atom cost associated with each primitive; and
      determining a cost of the feasible hybrid-manufacturing plan by multiplying the atom cost and the atom count for respective primitives and aggregating across the set of primitives.

7. The method of claim 1, wherein determining the optimized hybrid-manufacturing plan further comprises:
   applying a binary search to the costs to determine the optimized hybrid-manufacturing plan.

8. A non-transitory computer-readable storage medium storing instructions that when executed by a computer cause the computer to perform a method for determining a hybrid-manufacturing process plan for manufacturing an object, the method comprising:
   obtaining a set of hybrid-manufacturing constraints for manufacturing the object, wherein the set of hybrid-manufacturing constraints include a set of primitives, a set of atoms, and an atom end-state vector, wherein an atom corresponds to a unit of spatial volume of the object, and wherein a primitive represents an additive or subtractive manufacturing process corresponding to one or more atoms of the object;
   determining a plurality of feasible hybrid-manufacturing plans based on the set of hybrid-manufacturing constraints, wherein each feasible hybrid-manufacturing plan represents an ordering of the set of primitives that satisfies the atom end-state vector;
   determining costs for manufacturing the object using the plurality of feasible hybrid-manufacturing plans; and
   determining, based on the costs, an optimized hybrid-manufacturing plan for manufacturing the object.

9. The non-transitory computer-readable storage medium of claim 8, wherein the set of hybrid manufacturing constraints further comprises:
   a constraint matrix with the columns corresponding to the set of primitives and the rows corresponding to the set of atoms; and
   an atom cost vector.

10. The non-transitory computer-readable storage medium of claim 8, wherein the method further comprises converting the set of hybrid-manufacturing constraints to a satisfiability modulo theory (SMT) problem; and
    wherein determining the feasible hybrid-manufacturing plans comprises solving the SMT problem using a Satisfiability (SAT) modulo difference logic.

11. The non-transitory computer-readable storage medium of claim 8, wherein each cost is associated with one or more of:
    tool set-up cost;
    shut-down cost; and
    material cost.

12. The non-transitory computer-readable storage medium of claim 8, wherein the method further comprises converting the set of hybrid-manufacturing constraints to an SMT problem by:
    generating a conjunctive normal form (CNF) modulo difference logic formula; and
    converting the CNF difference logic formula to a Boolean formula, wherein the Boolean formula is implemented by using at least one or more Boolean subtractor circuits.

13. The non-transitory computer-readable storage medium of claim 8, wherein determining the plurality of feasible hybrid-manufacturing plans further comprises:

for a respective feasible hybrid-manufacturing plan:
sorting one or more columns in a constraint matrix based on one or more variables in the feasible hybrid-manufacturing plan, wherein each column corresponds to a primitive, and wherein sorting the one or more columns in the constraint matrix corresponds to changing an order of the set of primitives;
determining, for each primitive, an atom count representing a number of atoms added or deleted;
determining an atom cost associated with each primitive; and
determining a cost of the feasible hybrid-manufacturing plan by multiplying the atom cost and the atom count for respective primitives and aggregating across the set of primitives.

14. The non-transitory computer-readable storage medium of claim 8, wherein determining the optimized hybrid-manufacturing plan further comprises:
applying a binary search to the costs to determine the optimized hybrid-manufacturing plan.

15. A computer system for determining a hybrid-manufacturing process plan for manufacturing an object, the system comprising:
a processor; and
a storage device coupled to the processor and storing instructions, which when executed by the processor cause the processor to perform a method, wherein the method comprises:
obtaining a set of hybrid-manufacturing constraints for manufacturing the object, wherein the set of hybrid-manufacturing constraints include a set of primitives, a set of atoms, and an atom end-state vector, wherein an atom corresponds to a unit of spatial volume of the object, and wherein a primitive represents an additive or subtractive manufacturing process corresponding to one or more atoms of the object;
determining a plurality of feasible hybrid-manufacturing plans based on the set of hybrid-manufacturing constraints, wherein each feasible hybrid-manufacturing plan represents an ordering of the set of primitives that satisfies the atom end-state vector;
determining costs for manufacturing the object using the plurality feasible hybrid-manufacturing plans; and
determining, based on the costs, an optimized hybrid-manufacturing plan for manufacturing the object.

16. The computer system of claim 15, wherein the set of hybrid manufacturing constraints further comprises:
a constraint matrix with the columns corresponding to the set of primitives and the rows corresponding to the set of atoms; and
an atom cost vector.

17. The computer system of claim 15, wherein the method further comprises converting the set of hybrid-manufacturing constraints to a satisfiability modulo theory (SMT) problem; and
wherein determining the feasible hybrid-manufacturing plans comprises solving the SMT problem using a Satisfiability (SAT) modulo difference logic.

18. The computer system of claim 15, wherein the method further comprises converting the set of hybrid-manufacturing constraints to an SMT problem by:
generating a conjunctive normal form (CNF) modulo difference logic formula; and
converting the CNF difference logic formula to a Boolean formula, wherein the Boolean formula is implemented by using at least one or more Boolean subtractor circuits.

19. The computer system of claim 15, wherein determining the plurality of feasible hybrid-manufacturing plans further comprises:
for a respective feasible hybrid-manufacturing plan:
sorting one or more columns in a constraint matrix based on one or more variables in the feasible hybrid-manufacturing plan, wherein each column corresponds to a primitive, and wherein sorting the one or more columns in the constraint matrix corresponds to changing an order of the set of primitives;
determining, for each primitive, an atom count representing a number of atoms added or deleted;
determining an atom cost associated with each primitive; and
determining a cost of the feasible hybrid-manufacturing plan by multiplying the atom cost and the atom count for respective primitives and aggregating across the set of primitives.

20. The computer system of claim 15, wherein determining the optimized hybrid-manufacturing plan further comprises:
applying a binary search to the costs to determine the optimized hybrid-manufacturing plan.

* * * * *